United States Patent
Tohya et al.

[11] Patent Number: 6,002,593
[45] Date of Patent: Dec. 14, 1999

[54] REDUCING ELECTROMAGNETIC NOISE RADIATED FROM A PRINTED BOARD

[75] Inventors: Hirokazu Tohya; Shiro Yoshida, both of Tokyo, Japan

[73] Assignee: NEC Corporation, Tokyo, Japan

[21] Appl. No.: 09/081,137

[22] Filed: May 19, 1998

[30]   Foreign Application Priority Data

May 19, 1997   [JP]   Japan .................................... 9-128761

[51] Int. Cl.⁶ .............................. H05K 1/16; H05K 3/30; H05K 3/46
[52] U.S. Cl. .......................... 361/765; 333/185; 336/200; 336/232; 361/782
[58] Field of Search .................................. 174/250, 260, 174/261; 257/700, 531, 723, 532, 724; 29/603.01, 603.11, 603.24, 609; 333/177, 184, 185, 246; 336/200, 225, 229, 223, 232; 361/738, 760, 763, 765, 766, 782

[56]   References Cited

FOREIGN PATENT DOCUMENTS

| | | |
|---|---|---|
| 4306416 | 9/1994 | Germany . |
| 58-080805 | 5/1983 | Japan . |
| 58-157109 | 9/1983 | Japan . |
| 58-157112 | 9/1983 | Japan . |
| 58-188115 | 11/1983 | Japan . |
| 63-300593 | 12/1988 | Japan . |
| 64-25497 | 1/1989 | Japan . |
| 2-181961 | 7/1990 | Japan . |
| 3-214863 | 10/1991 | Japan . |
| 3-273699 | 12/1991 | Japan . |
| 4-229076 | 8/1992 | Japan . |
| 6-112655 | 4/1994 | Japan . |
| 7-263755 | 10/1995 | Japan . |
| 8-293416 | 11/1996 | Japan . |
| 11-40915 | 2/1999 | Japan . |

*Primary Examiner*—Donald Sparks
*Attorney, Agent, or Firm*—Sughrue, Mion, Zinn, Macpeak & Seas, PLLC

[57]   ABSTRACT

A printed board has at least two conductor layers including a power supply layer and a ground layer, and a spiral coil inductor disposed in opposite ones of the conductor layers. The spiral coil inductor has a terminal connected to a power supply line of the power supply layer, and another terminal connected to a device power terminal disposed on one of the conductor layers and to be connected to a power supply terminal of a circuit device and a terminal of a decoupling capacitor. A device ground terminal is disposed on one of the conductor layers and to be connected to a ground terminal of the circuit device and another terminal of the decoupling capacitor, the device ground terminal being connected to a ground line of the ground layer.

15 Claims, 9 Drawing Sheets

REDUCING ELECTROMAGNETIC NOISE RADIATED FROM A PRINTED BOARD

BACKGROUND OF THE INVENTION

1. Field of the Invention

The present invention relates to a printed board which supports circuit devices including transistors, ICs (Integrated Circuits), LSI (Large Scale Integration) circuits, etc.

2. Description of the Related Art

Printed boards support circuit devices including transistors, ICs, LSI circuits, etc. suffer conductive or radiant electromagnetic noise due to high-frequency currents generated by the circuit devices and circulating currents known as a common-mode signal flowing through parasitic capacitances and parasitic mutual inductances which circuits on the printed boards have. When electromagnetic noise is generated, it tends to cause an error in electronic units which incorporate such printed boards or other electronic units.

Figure 1:
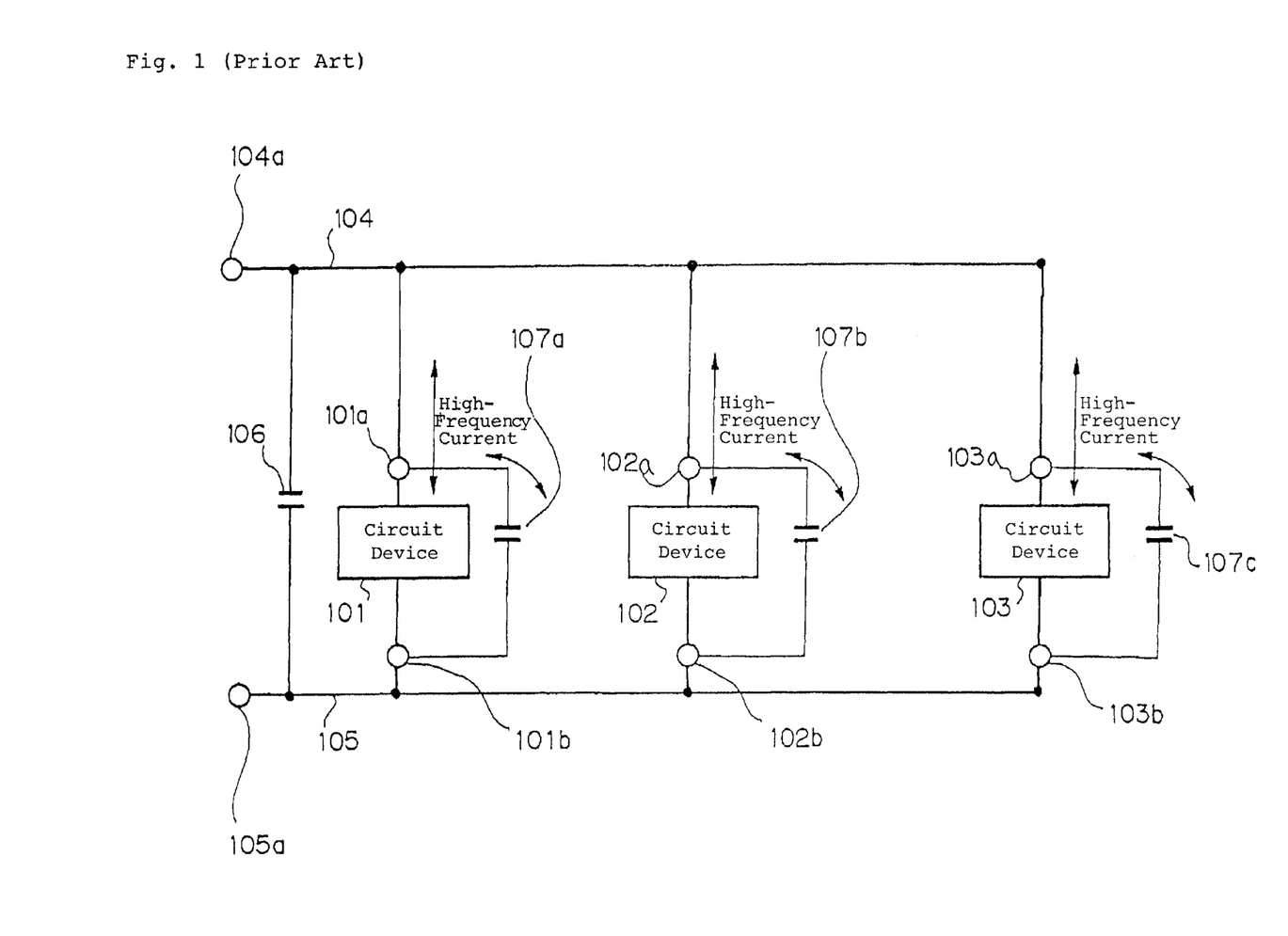
FIG. 1 is an equivalent circuit diagram of a conventional printed board.

To solve the above problem, one conventional printed board has employed circuit interconnections as shown in FIG. 1 of the accompanying drawings. As shown in FIG. 1, the conventional printed board supports circuit devices 101, 102, 103 for generating high-frequency currents whose magnitudes are different from each other, the circuit devices 101, 102, 103 being connected parallel to each other between a power supply line 104 and a ground line 105. The circuit device 101 generates a high-frequency current whose magnitude is the greatest, the circuit device 102 generates a high-frequency current whose magnitude is the second greatest, and the circuit device 103 generates a high-frequency current whose magnitude is the third greatest. The power supply line 104 is formed in a power supply layer (not shown) of the printed board, and the ground line 105 in a ground layer (not shown) of the printed board. The power supply layer is disposed as a planar layer which comprises an electrically conductive layer formed over the entire surface of the printed board.

The printed board is supplied with electric energy from a power supply which is connected to a power supply terminal 104a of the power supply line 104 and a power supply ground terminal 105a of the ground line 105. A decoupling capacitor 106 is connected between the power supply line 104 and the ground line 105 near the power supply terminal 104a and the power supply ground terminal 105a.

Decoupling capacitors 107a, 107b, 107c, which have respective capacitances commensurate with the magnitudes of the high-frequency currents generated by the respective circuit devices 101, 102, 103, are connected across the respective circuit devices 101, 102, 103 between power supply terminals 101a, 102a, 103a and ground terminals 101b, 102b, 103a of the respective circuit devices 101, 102, 103. The decoupling capacitor 107a has an electrostatic capacitance whose magnitude is the greatest, the decoupling capacitor 107b has an electrostatic capacitance whose magnitude is the second greatest, and the decoupling capacitor 107c has an electrostatic capacitance whose magnitude is the third greatest. Since the impedances of the decoupling capacitors 107a, 107b, 107c are inversely proportional to the magnitudes of their electrostatic capacitances, the decoupling capacitor 107c has an impedance whose magnitude is the greatest, the decoupling capacitor 107b has an impedance whose magnitude is the second greatest, and the decoupling capacitor 107a has an impedance whose magnitude is the third greatest.

The high-frequency currents generated by the circuit devices 101, 102, 103 flow respectively through the decoupling capacitors 107a, 107b, 107c to the ground line 105, so that the voltages at the power supply terminals 101a, 102a, 103a of the circuit devices 101, 102, 103 are prevented from varying.

In as much as the power supply layer of the printed board is formed as a planar layer over the entire surface of the printed board, the resistance, i.e., the impedance, of the power supply line 104 is small. Consequently, the voltage at the power supply layer is also prevented from varying even when high-frequency currents flow into the power supply line 104.

The impedance of the power supply layer is smaller than the impedances of the decoupling capacitors 107a, 107b, 107c. Therefore, the high-frequency currents generated by the circuit devices 101, 102, 103 may not flow through the decoupling capacitors 107a, 107b, 107c, but may flow through the power supply layer into other circuit devices or decoupling capacitors which have smaller impedances or larger electrostatic capacitances.

Since the high-frequency currents flowing through the decoupling capacitors 107a, 107b, 107c are very complicated, it is difficult to accurately grasp electrostatic capacitances that are required by the respective decoupling capacitors 107a, 107b, 107c. In addition, decoupling capacitors have different impedance vs. frequency characteristics depending on the electrostatic capacitance even if they are of the same type. For example, the impedance of a decoupling capacitor having a smaller electrostatic capacitance tends to be smaller than the impedance of a decoupling capacitor having a larger electrostatic capacitance at frequencies higher than a certain frequency. Consequently, high-frequency currents whose frequencies reside in a wide frequency band flow into and out of the decoupling capacitors. For this reason, printed boards need to be fitted with many capacitors whose electrostatic capacitances are much greater than the electrostatic capacitances that are theoretically required.

When a high-frequency current flows into the planar power supply layer, the high-frequency current may act as a loop current in the power supply layer, or a common-mode high-frequency current may flow into a cable connected to the printed board, resulting in the radiation of electromagnetic noise. If a high-frequency current generated by a circuit device does not flow into a decoupling capacitor connected thereacross, but flows into another path, then the impedance of the path is increased, causing a large voltage variation in another circuit device, whose stable operation will adversely be affected.

An electronic unit which comprises a plurality of such printed boards is housed in a metallic casing for preventing electromagnetic noise from leaking out. Cables connected to the electronic unit and extending out of the casing are fitted with common-mode coils and cores for suppressing the conduction of electromagnetic noise. However, because of the presence of openings defined in the casing which receive control knobs and switches of the electronic unit, it is difficult to completely reject the leakage of electromagnetic noise out of the casing.

Formation of inductors on printed boards with printed interconnections on the printed boards is disclosed in Japanese laid-open patent publications Nos. 300593/88, 25497/89, 273699/91, and 293416/96.

Specifically, Japanese laid-open patent publication No. 300593/88, discloses laminating a magnetic sheet to a coil pattern to form an inductor for thereby increasing the inductance. According to Japanese laid-open patent publication No. 25497/89, a magnetic layer is disposed on a first conductor layer, and covered with a second conductor layer, making up an inductive device.

Japanese laid-open patent publications Nos. 273699/91 and 293416/96 show the formation of a coil-shaped inductor by successively connecting printed interconnections on two superposed conductor layers via through holes.

All the above disclosed conventional arrangements employ printed interconnections on the printed board to form an inductor on the printed board. Nothing in the disclosed printed boards refers to reducing electromagnetic noise radiated from a printed circuit having decoupling circuits as described with reference to FIG. 1.

SUMMARY OF THE INVENTION

It is an object of the present invention to provide a printed board which will radiate reduced electromagnetic noise.

According to the present invention, a printed board has at least two conductor layers including a power supply layer and a ground layer, and a spiral coil inductor disposed in opposite ones of the conductor layers. The spiral coil inductor has a terminal connected to a power supply line of the power supply layer, and another terminal connected to a device power terminal disposed on one of the conductor layers and to be connected to a power supply terminal of a circuit device and a terminal of a decoupling capacitor. This arrangement increases the impedance between the power supply line and the circuit device. A device ground terminal is disposed on one of the conductor layers and to be connected to a ground terminal of the circuit device and another terminal of the decoupling capacitor, the device ground terminal being connected to a ground line of the ground layer. A high-frequency current generated by the circuit device flows through the decoupling capacitor to the ground layer. As a result, electromagnetic noise radiated from the printed board is reduced.

The spiral coil inductor may comprise a toroidal spiral coil inductor for thereby increasing the impedance between the power supply line and the circuit device even though only a limited area is available for installing the spiral coil inductor.

The opposite ones of the conductor layers may comprise the power supply layer and the ground layer, respectively. Since conductor lines of the spiral coil inductors are formed by defining frame-like recesses in the conductor-layers, the conductor lines are insulated from and electrically independent of the conductor layers. Accordingly, the spiral coil inductors may be disposed between any two opposite conductor layers. Even if the conductor layers comprise only power supply and ground layers, other conductor layers do not need to be added for providing the spiral coil inductor.

The conductor layers may comprise two opposite power supply layers and two ground layers disposed respectively on surfaces of the two opposite power supply layers, and the conductor lines of the spiral coil inductor may be disposed on the two opposite power supply layers. The spiral coil inductors disposed between the power supply layers are sandwiched by the ground layers, and hence provide stable characteristics. The ground layers serve as a shield for reducing the effect of a magnetic field generated by the toroidal spiral coil inductors on the signal layers.

The conductor layers may further comprise two signal layers disposed respectively on surfaces of the ground layers, the through holes or via holes including through holes or via holes extending through the power supply layers and the ground layers and interconnecting the signal layers and through holes or via holes extending through the power supply layers and interconnecting the ground layers, the through holes or via holes being disposed closely to each other, lowering the impedance between the signal layers and the ground layers. The lowered impedance between the signal layers and the ground layers reduces electromagnetic noise induced by signal currents flowing through the through holes or via holes and minimizes distortions of the signal waveform.

Preferably, the printed board further comprises an insulating layer disposed between the opposite ones of the conductor layers, the insulating layer containing a magnetic material. The insulating layer mixed with a magnetic material functions as the magnetic core of the spiral coil inductors, so that the inductance of the spiral coil inductors increases.

The insulating layer may be disposed in a coil interior surrounded by at least the conductor lines of the spiral coil inductor and the through holes or via holes. The insulating layer mixed with a magnetic material also functions as the magnetic core of the spiral coil inductors The insulating layer may comprise an insulating solvent mixed with a fine powder of Ni—Zn ferrite as the magnetic material, or an insulating solvent mixed with a fine powder of Mn—Zn ferrite as the magnetic material, or an insulating solvent mixed with a fine powder of Li ferrite as the magnetic material, or an insulating solvent mixed with a fine powder of Sendust as the magnetic material, or an insulating solvent mixed with a fine powder of amorphous material as the magnetic material, or an insulating solvent mixed with a fine powder of Permalloy as the magnetic material. Further alternatively, the insulating layer may comprise an amorphous material foil having opposite surfaces each coated with an insulating coating.

According to the present invention, furthermore, a printed board comprises at least two conductor layers and a toroidal spiral coil inductor comprising a plurality of conductor lines defined by frame-like recesses defined in opposite ones of the conductor layers, and through holes or via holes interconnecting the conductor lines. Since the toroidal spiral coil inductor has a longer coil average magnetic path than a spiral coil inductor, the inductance of the inductor on the printed board increases.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 3:
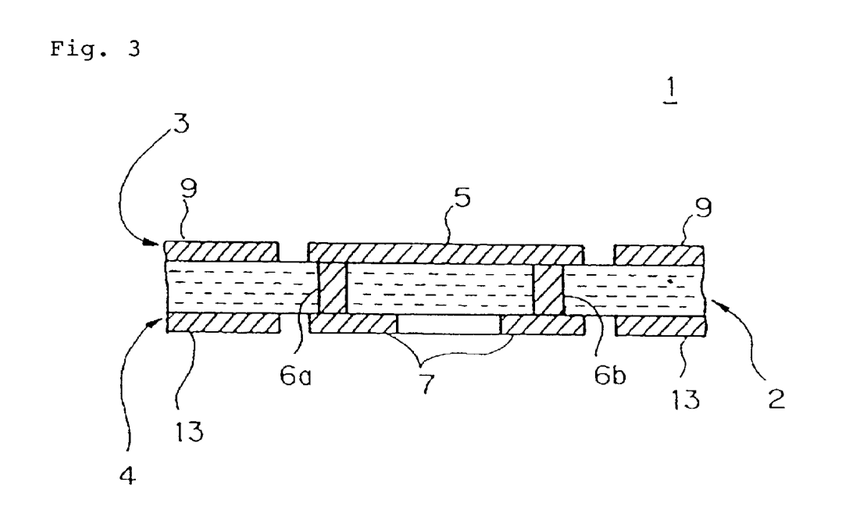
FIG. 3 is an enlarged cross-sectional view taken along line III—III of FIG. 2.
Figure 4:
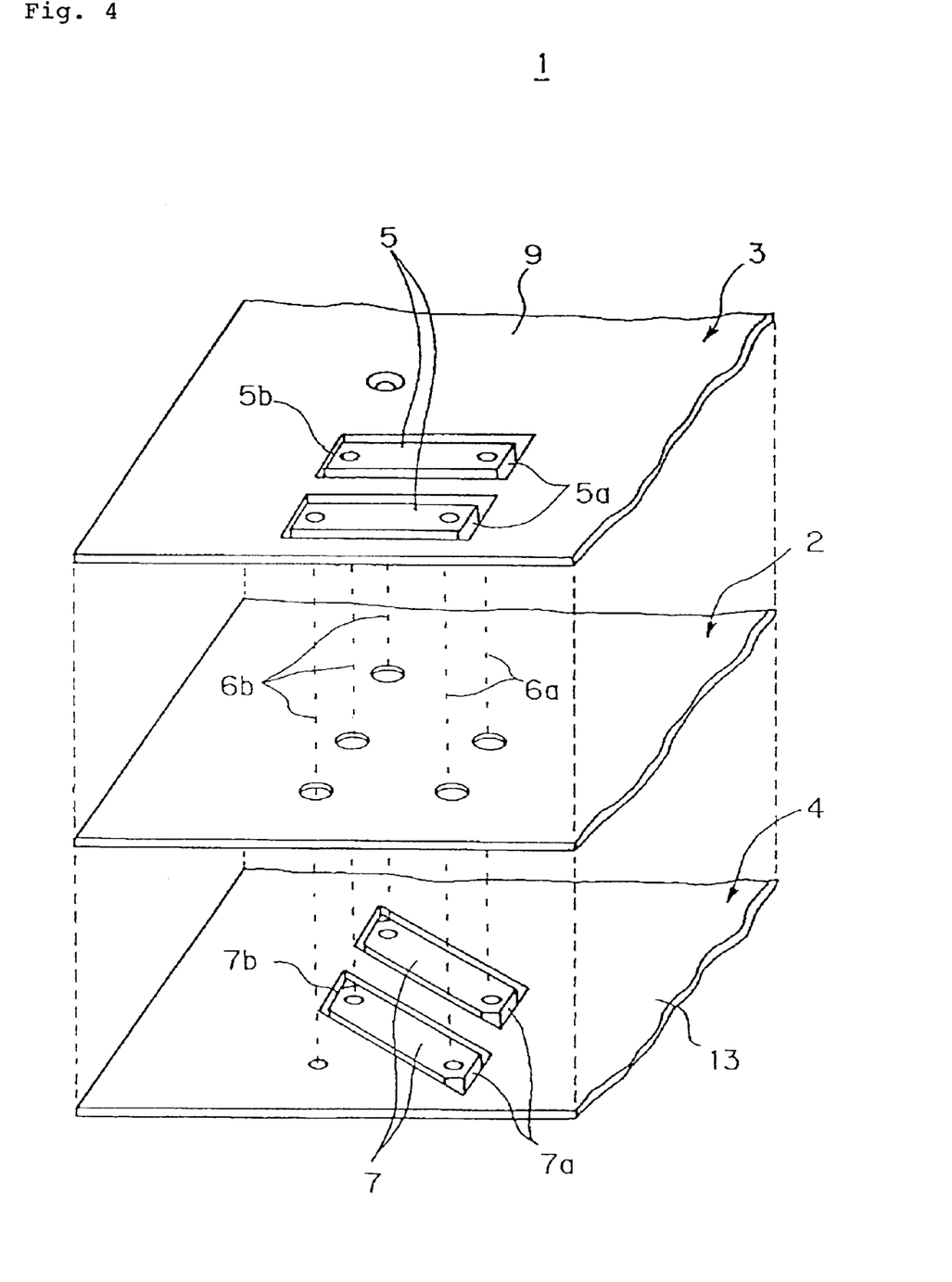
FIG. 4 is an exploded perspective view of the printed board shown in FIG. 2, illustrating a power supply layer, an insulating layer, and a ground layer separately from each other.

As shown in FIGS. 3 and 4, a printed board 1 according to a first embodiment of the present invention has a power supply layer 3 disposed on an upper surface of an insulating layer 2 and a ground layer 4 disposed on a lower surface of the insulating layer 2. Each of the power supply layer 3 and the ground layer 4 serves as a conductor layer and is formed of an electrically conductive material such as copper foil or the like.

The power supply layer 3 comprises a power supply line 9 having a power supply terminal (not shown) for connection to a power supply (not shown), and the ground layer 4 comprises a ground line 13 having a power supply ground terminal (not shown) for connection to the power supply. Circuit devices (not shown) including transistors, ICs, LSI circuits, etc. mounted on the printed board 1 each have a power supply terminal (not shown) and a ground terminal (not shown). The power supply terminals of the circuit devices are to be connected to device power terminals 3a (see FIG. 5) of the power supply layer 3, and the ground terminals of the circuit devices are to be connected to device ground terminals 4a (see FIG. 5) of the ground layer 4. The device ground terminals 4a are connected to the ground line 13. Decoupling capacitors (not shown) are to be connected between the device power terminals 3a and the device ground terminals 4a. A decoupling capacitor is also to be connected between the power supply line 9 and the ground line 13 near the power supply terminal and the power supply ground terminal.

Figure 2:
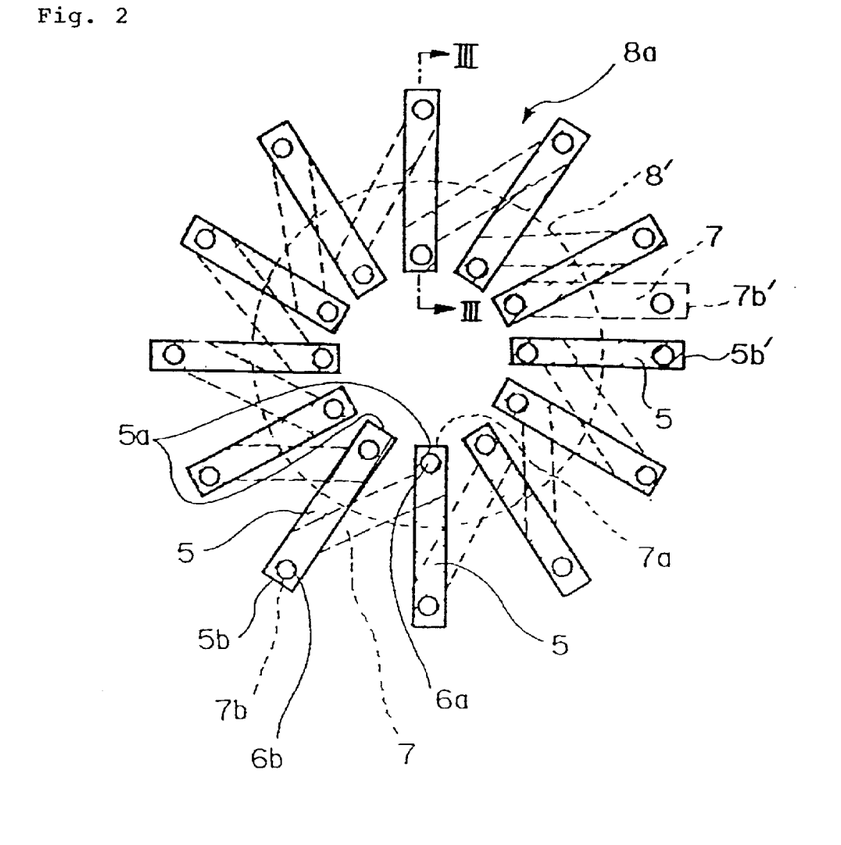
FIG. 2 is a partial plan view of a printed board according to a first embodiment of the present invention.

Frame-like recesses are defined in the power supply layer 3, leaving a plurality of conductor lines 5 in the power supply layer 3. As shown in FIG. 2, the conductor lines 5 are disposed at equal angular intervals in a radial pattern around a certain central point. In FIG. 4, the conductor lines 5 are shown parallel to each other for illustrative purpose. Each of the conductor lines 5 has through holes 6a, 6b defined respectively in radially inner and outer ends 5a, 5b thereof, the through holes 6a, 6b extending and connected to the ground layer 4 (see FIG. 3). In FIG. 2, the power supply line 9 and the ground line 13 are omitted from illustration.

As shown in FIGS. 3 and 4, frame-like recesses are defined in the ground layer 4, leaving as many conductor lines 7 in the ground layer 4 as the number of conductor lines 5. As shown in FIG. 2, each of the conductor lines 7 has a radially inner end 7a connected to the through hole 6a defined in the radially inner end 5a of one of the conductor lines 5, and a radially outer end 7b connected to the radially outer end 5b of an adjacent one of the conductor lines 5. One of the conductor lines 5 has a radially outer end 5b' connected to the power supply terminal of the power supply layer 3 (see FIG. 3), and one of the conductor lines 7 has a radially outer end 7b' connected to one of the device power terminals of the power supply layer 3. No through hole is defined between the radially outer end 5b' and the radially outer end 7b'.

The conductor lines 5, 7 and the through holes 6a, 6b jointly make up a toroidal spiral coil inductor 8a (see FIG. 2) disposed between the power supply layer 3 and the ground layer 4, i.e., within the printed board 1.

Figure 5:
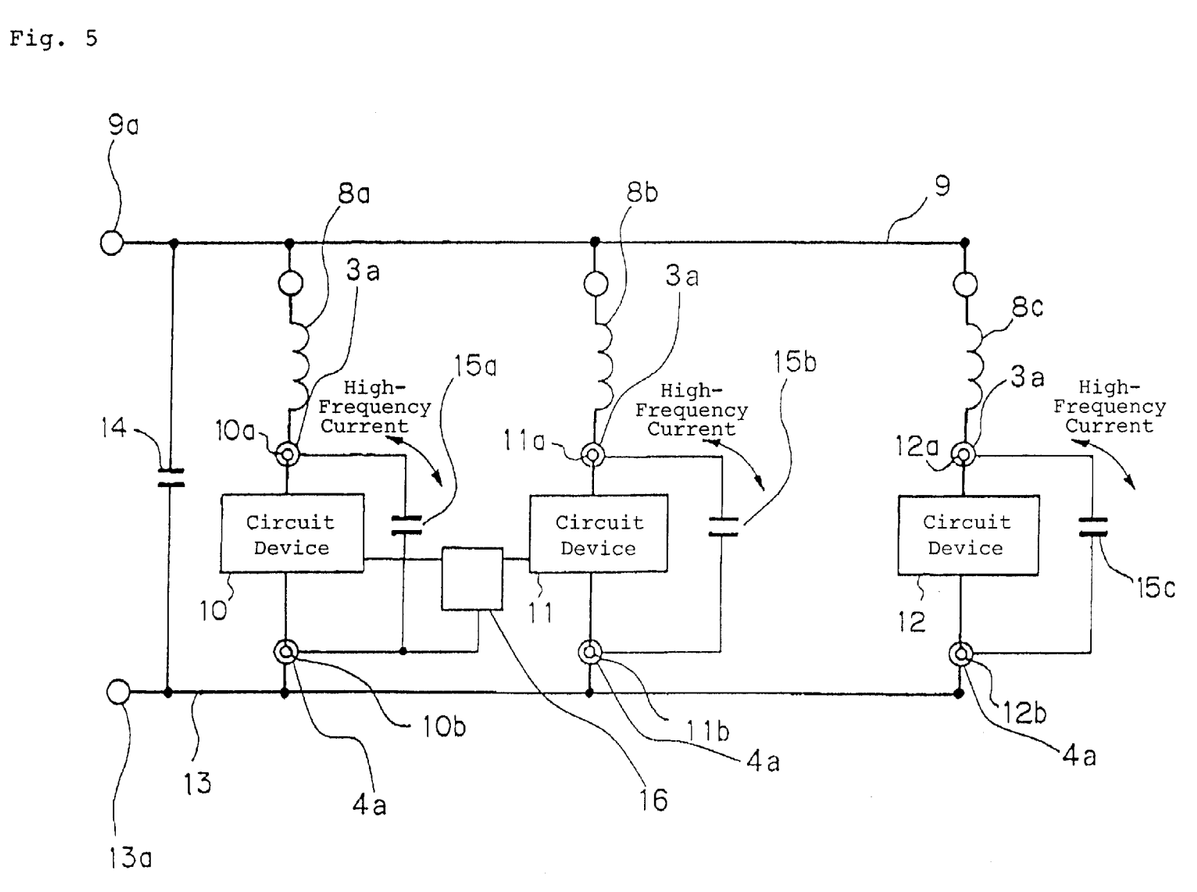
FIG. 5 is an equivalent circuit diagram of the printed board according to the first embodiment.

As shown in FIG. 5, the printed board according to the first embodiment has a plurality of toroidal spiral coil inductors 8a, 8b, 8c, each identical to the toroidal spiral coil inductor 8a shown in FIG. 2, connected between a power supply line 9 and respective device power terminals 3a of the power supply layer 3 (see FIG. 3). Circuit devices 10, 11, 12 have respective power supply terminals 10a, 10b, 10c connected respectively to the device power terminals 3a, and respective ground terminals 10b, 11b, 12b connected respectively to device ground terminals 4a of the ground line 13 (see FIG. 3). Decoupling capacitors 15a, 15b, 15c are connected across the respective circuit devices 10, 11, 12 between the device power terminals 3a and the device ground terminals 4a, thus making up decoupling circuits associated respectively with the circuit devices 10, 11, 12. A high-frequency filter 16 comprising a toroidal spiral coil inductor is connected between the circuit devices 10, 11. The toroidal spiral coil inductors 8a, 8b, 8c have respective capacitances depending on the magnitudes of high-frequency currents generated respectively by the circuit devices 10, 11, 12.

The power supply line 9 has a power supply terminal 9a, and the ground line 13 has a power supply ground terminal 13a. A decoupling capacitor 14 is to be connected between the power supply line 9 and the ground line 13 near the power supply terminal 9a and the power supply ground terminal 13a. A power supply (not shown) is to be connected to the power supply terminal 9a and the power supply ground terminal 13a. The power supply terminal 9a, the power supply ground terminal 13a, the decoupling capacitor 14, and the power supply are identical to those described with respect to the conventional printed board shown in FIG. 1, and will not be described in detail below. The printed board according to the first embodiment may support as many circuit devices as desired, not just three circuit devices as illustrated, and those circuit devices are associated with respective decoupling circuits. The toroidal spiral coil inductor as a high-frequency filter 16 may be connected between other circuit devices as well as between the circuit devices 10, 11. The through holes 6a, 6b and other through holes described later on may be replaced with via holes.

Figure 6:
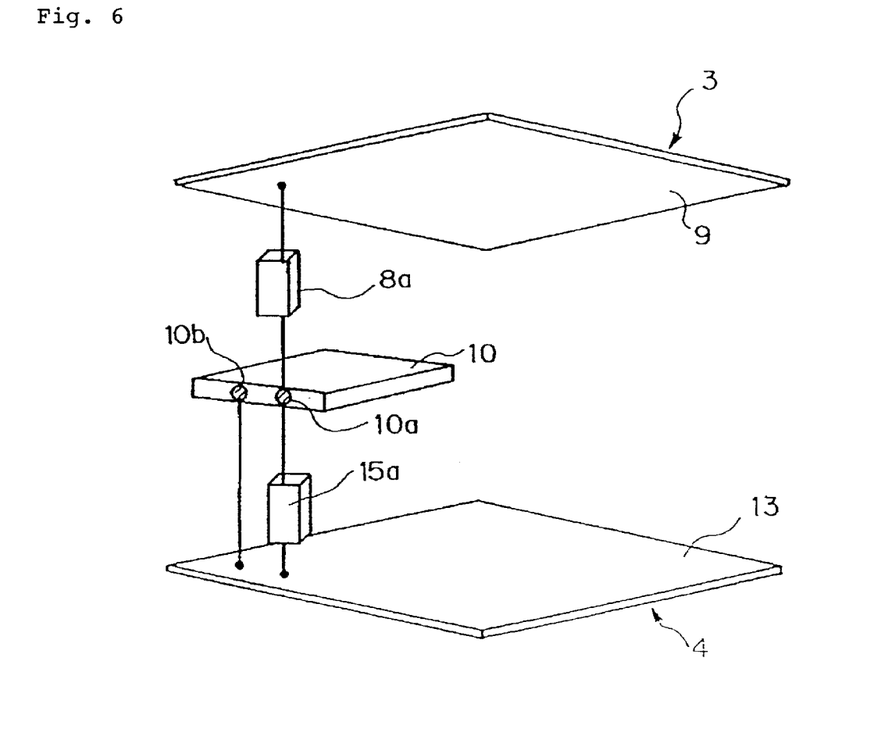
FIG. 6 is a perspective view of a connected structure of one of decoupling circuits of the printed board shown in FIG. 5.

FIG. 6 shows in perspective a connected structure of one of the decoupling circuits of the printed board shown in FIG. 5. The toroidal spiral coil inductor 8a has a terminal connected to the power supply line 9 of the power supply layer 3 and another terminal connected to the power supply terminal 10a of the circuit device 10. The decoupling capacitor 15a has a terminal connected to the power supply terminal 10a and another terminal connected to the ground line 13 of the ground layer 4. The ground terminal 10b of the circuit device 10 is connected to the ground line 13.

With the conventional printed board, as described above, since the impedance of the power supply layer is smaller than the impedances of the decoupling capacitors, high-frequency currents generated by the circuit devices may not flow through the decoupling capacitors, but may flow through the power supply layer into other circuit devices or decoupling capacitors.

According to the present invention, however, the toroidal spiral coil inductors 8a, 8b, 8c provide large impedances between the power supply line 9 and the circuit devices 10, 11, 12. Therefore, high-frequency currents generated by the circuit devices 10, 11, 12 do not flow through the power supply line 9, but flow through the decoupling capacitors 15a, 15b, 15c to the ground line 13. Consequently, the high-frequency currents generated by the circuit devices 10, 11, 12 are less likely to flow through the power supply layer 3 into the circuit devices 10, 11, 12 and the decoupling capacitors 15a, 15b, 15c.

Since the decoupling capacitors 15a, 15b, 15c are supplied with only the high-frequency currents generated by the circuit devices 10, 11, 12 positioned closely to the decoupling capacitors 15a, 15b, 15c, the magnitudes of the high-frequency currents are able to be grasped, it is possible to determine the electrostatic capacitances of the decoupling capacitors 15a, 15b, 15c with accuracy. In as much as high-frequency currents flowing into the power supply layer 3 are suppressed, no appreciable loop current is produced in the power supply layer 3, so that no electromagnetic noise will be radiated and noise immunity is prevented from being impaired. Because high-frequency currents generated by the circuit devices 10, 11, 12 are prevented from flowing into the other circuit devices 10, 11, 12, voltage variations in the circuit devices 10, 11, 12 are suppressed, and hence the circuit devices 10, 11, 12 can operate-more stably.

As shown in FIG. 4, the power supply layer 3 which provides the power supply line 9 is formed as a planar layer except the conductor lines 5, the power supply line 9 has a relatively small resistance, and hence voltage variations in the power supply line 9 are suppressed. Any voltage variations in the circuit devices 10, 11, 12 can be minimized when the resistances of the toroidal spiral coil inductors 8a, 8b, 8c are minimized by selecting the length and width of the conductor lines 5, 7 of the toroidal spiral coil inductors 8a, 8b, 8c.

As shown in FIG. 5, the toroidal spiral coil inductor connected as a high-frequency 16 filter between the circuit devices 10, 11 tends to reduce the rate at which a rectangular-wave signal rises or falls in the circuit devices 10, 11 even if the circuit devices 10, 11 comprise high-speed processing ICs or LSI circuits. Therefore, the printed board is less subject to conductive or radiant electromagnetic noise which would otherwise occur if a rectangular-wave signal rises or falls too fast in the circuit devices 10, 11.

The toroidal spiral coil inductors 8a, 8b, 8c, 8d are disposed between the power supply layer 3 and the ground layer 4 within the printed board 1. Since no inductors need to be separately mounted on the printed board 1, the printed board 1 provides a wider interconnection area thereon. Even though spaces are limited for installing the toroidal spiral coil inductors 8a, 8b, 8c therein, the toroidal spiral coil inductors 8a, 8b, 8c are effective in increasing the impedance between the power supply line 9 and the circuit devices 10, 11, 12.

In the decoupling circuit shown in FIG. 6, it is preferable to make as short as possible the path from the power supply terminal 10a through the decoupling capacitor 15a to the ground line 13. Since this is effective to reduce the resistance through the decoupling capacitor 15a, the high-frequency current generated by the circuit device 10 finds it easier to flow through the decoupling capacitor 15a.

The toroidal spiral coil inductor shown in FIG. 2 will be described below.

The structure of a non-toroidal spiral coil inductor will be described below for comparison with a toroidal spiral coil inductor.

Figure 7:
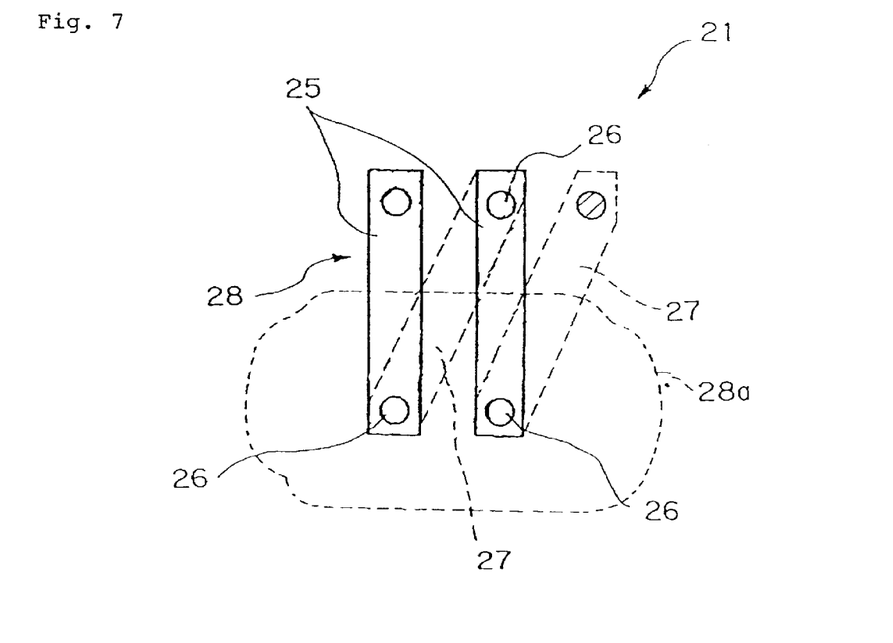
FIG. 7 is a partial plan view of a printed board with a non-toroidal spiral coil inductor.

As shown in FIG. 7, a plurality of conductor lines 25 of a power supply layer and a plurality of conductor lines 27 of a ground layer are disposed in a superimposed zigzag pattern in a printed board 21. The conductor lines 25, 27 have ends interconnected by through holes 26. The conductor lines 25, 27 and the through holes 26 jointly provide a non-toroidal spiral coil inductor 28 between the power supply layer and the ground layer of the printed board 21.

Generally, the inductance L of a spiral coil inductor is expressed by:

$$L = \mu_0 \mu_s n^2 s / l \, [H]$$

where $\mu_0$ represents permeability ($4\pi \times 10^{-7}$) in vacuum, $\mu_s$ relative specific permeability, n the number of turns of the spiral coil, s the cross-sectional area [m$^2$] of the spiral coil, and l the average magnetic path length [m] of the spiral coil.

As can be seen from the above equation, the inductance of the spiral coil inductor is proportional to the square of the number of turns of the spiral coil, and is greater as the average magnetic path length is greater.

As shown in FIG. 7, the average magnetic path length of the non-toroidal spiral coil inductor 28 is represented by a closed curve 28a extending between radially outer and inner ends of the spiral coil. However, the closed curve 28a extending near the radially outer end of the spiral coil may not necessarily be uniform and shortest in length. On the other hand, the toroidal spiral coil inductor 8a shown in FIG. 2 has an average magnetic path length represented by a closed curve 8' which is uniform and shortest in length. Therefore, the toroidal spiral coil inductor provides a greater inductance.

Figure 8:
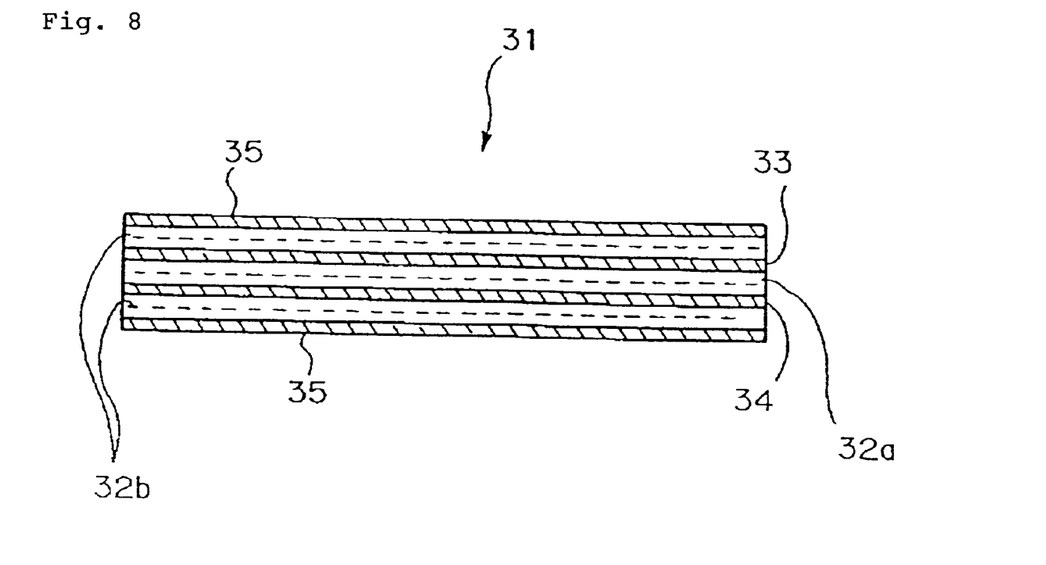
FIG. 8 is a cross-sectional view of a first modification of the printed board shown in FIGS. 2 through 6.

FIG. 8 shows in cross section a first modification of the printed board shown in FIGS. 2 through 6. As shown in FIG. 8, a printed board 31 according to the first modification has a power supply layer 33 disposed on an upper surface of a first insulating layer 32a and a ground layer 34 disposed on a lower surface of the first insulating layer 32a. Second insulating layers 32b are disposed respectively on outer surfaces of the power supply layer 33 and the ground layer 34. Signal layers 35 having interconnections for transmitting signals are disposed respectively on outer surfaces of the second insulating layers 32b. Toroidal spiral coil inductors (not shown) are disposed between the power supply layer 33 and the ground layer 34.

Conductor lines and through holes (not shown) of the toroidal spiral coil inductors, the power supply layer 33, the ground layer 34, circuit devices (not shown) which are to be connected to the printed board 31, and decoupling capacitors (not shown) are identical to those of the printed board shown in FIGS. 2 through 5, and will not be described in detail below. In the printed board shown in FIGS. 2 through 5, the device power terminals are disposed on the power layer, and the device ground terminals are disposed on the ground layer. However, the device power terminals and the device ground terminals may be disposed on any of these conductor layers.

As described above, the toroidal spiral coil inductors are disposed between the power supply layer 33 and the ground layer 34, i.e., within the printed board 31. Therefore, the toroidal spiral coil inductors may be disposed in a printed circuit having two or more conductor layers as shown in FIG. 8. Since conductor lines of the toroidal spiral coil inductors are formed by defining frame-like recesses in the conductor layers, the conductor lines are insulated from and electrically independent of the conductor layers. Accordingly, the conductor lines may not necessarily be formed in the power supply layer 33 and the ground layer 34, but may be formed in the signal layers 35. Consequently, the toroidal spiral coil inductors may be disposed between any two opposite conductor layers, e.g., between the power supply layer 33 and the opposite signal layer 35 or between the ground line 34 and the opposite signal layer 35.

Figure 9:
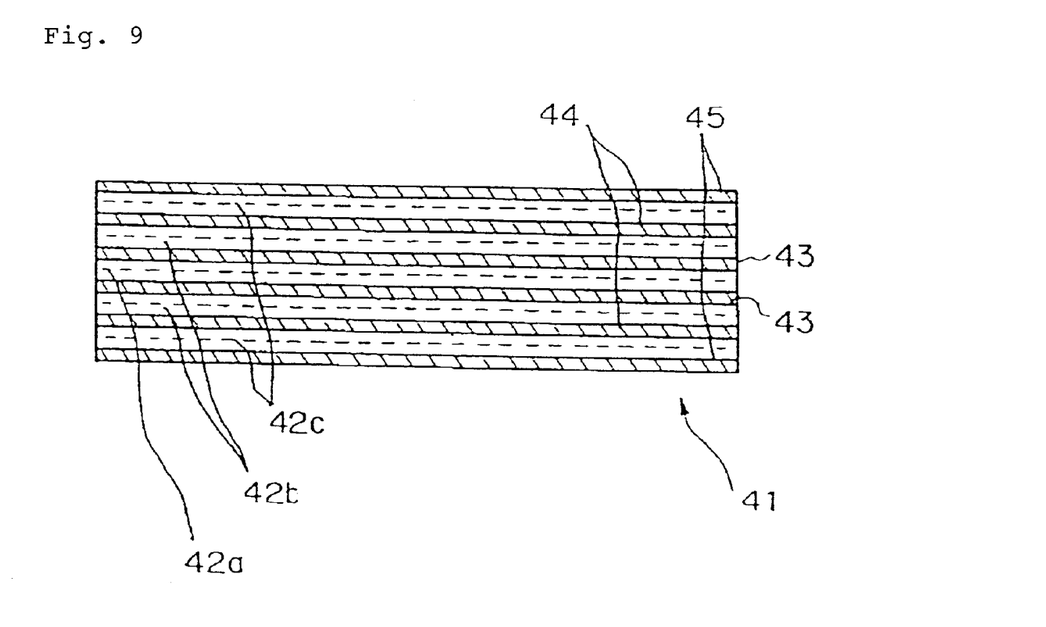
FIG. 9 is a cross-sectional view of a second modification of the printed board shown in FIGS. 2 through 6.

FIG. 9 shows in cross section a second modification of the printed board shown in FIGS. 2 through 6. As shown in FIG. 9, a printed board 41 according to the second modification has two power supply layers 43 disposed on respective surfaces of a first insulating layer 42a, two second insulating layers 42b disposed on respective outer surfaces of the power supply layers 43, and two ground layers 44 disposed on respective outer surfaces of the second insulating layers 42b. Third insulating layers 42c are disposed respectively on outer surfaces of the ground layers 44, and signal layers 45 are disposed respectively on outer surfaces of the third insulating layers 42c. Toroidal spiral coil inductors (not shown) are disposed between the two power supply layers 43.

Conductor lines and through holes (not shown) of the toroidal spiral coil inductors, the power supply layers 43, the ground layers 44, device power terminals (not shown), device ground terminals (not shown), circuit devices (not shown) which are to be connected to the printed board 41, and decoupling capacitors (not shown) are identical to those of the printed board shown in FIGS. 2 through 5, and will not be described in detail below. In the printed board shown in FIGS. 2 through 5, the device power terminals are disposed on the power layer, and the device ground terminals are disposed on the ground layer. However, the device power terminals and the device ground terminals may be disposed on any of these conductor layers.

The toroidal spiral coil inductors disposed between the power supply layers 43 are sandwiched by the ground layers 44, and hence provide stable characteristics. The ground layers 44 serve as a shield for reducing the effect of a magnetic field generated by the toroidal spiral coil inductors on the signal layers 45.

With the toroidal spiral coil inductors sandwiched by the ground layers 44, the conductor lines of the power supply layers 43 and the ground layers 44 which face those conductor lines are electrostatically coupled to reduce the impedances of the toroidal spiral coil inductors.

The impedance $Z_0$ of a toroidal spiral coil inductor in the second modification is represented by:

$$Z_0 = \sqrt{(L/C)} \quad [\Omega]$$

where L indicates the inductance [H] of the toroidal spiral coil inductor, and C the electrostatic capacitance [F] between conductor lines of the power supply layer and the ground layer which face each other across a dielectric insulating layer.

Since the electrostatic capacitance C is proportional to the area of the confronting conductors, the electrostatic capacitance C increases in proportion to the length of the conductor lines if the width of the conductor lines is constant. Therefore, the impedance $Z_0$ decreases in proportion to the length of the conductor lines, and hence is prevented from increasing. However, the inductance L increases in proportion to the square of the number of turns of the spiral coil. Since the overall length of the conductor lines increases as the number of turns of the spiral coil increases, the impedance $Z_0$ increases in proportion to the square of the length of the conductor lines.

Consequently, even with the toroidal spiral coil inductors sandwiched by the ground layers 44, if the length of the conductor lines of the toroidal spiral coil inductors is increased to increase the number of turns of the spiral coil, then the inductance L increases much more than the electrostatic capacitance C. Therefore, even though the impedance $Z_0$ is prevented from increasing by the action of the electrostatic capacitance C, the impedance $Z_0$ can be of a greater value.

It can be understood from the above equation that the impedance $Z_0$ is not related to the frequency of the applied voltage.

Figure 10:
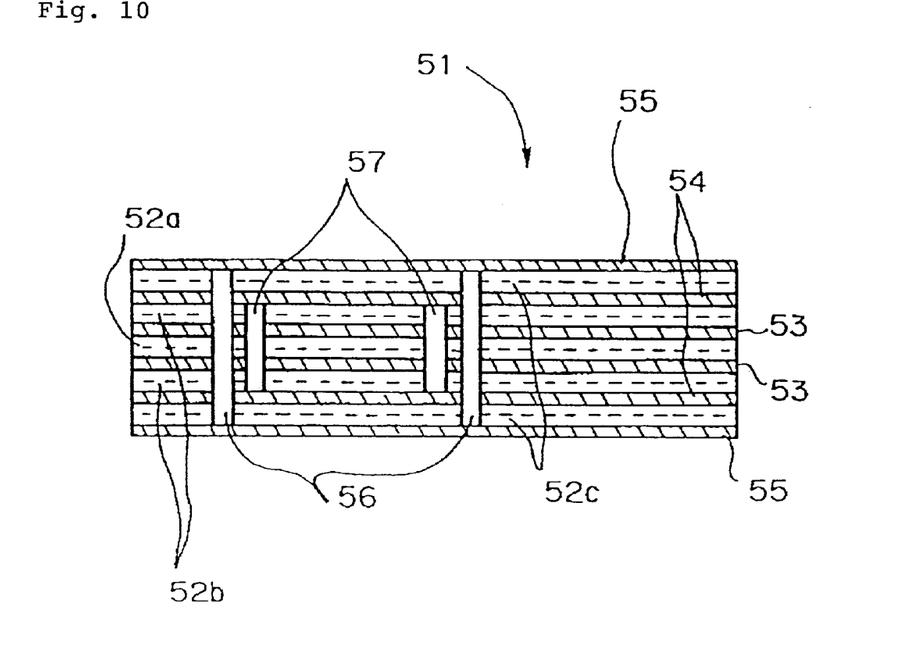
FIG. 10 is a cross-sectional view of a third modification of the printed board shown in FIGS. 2 through 6.

FIG. 10 shows in cross section of a third modification of the printed board shown in FIGS. 2 through 6.

As shown in FIG. 10, a printed board 51 according to the third modification has two power supply layers 53 disposed on respective surfaces of a first insulating layer 52a, two second insulating layers 52b disposed on respective outer surfaces of the power supply layers 53, and two ground layers 54 disposed on respective outer surfaces of the second insulating layers 52b. Third insulating layers 52c are disposed respectively on outer surfaces of the ground layers 54, and signal layers 55 are disposed respectively on outer surfaces of the third insulating layers 52c. Toroidal spiral coil inductors (not shown) are disposed between the two power supply layers 53.

The printed board 51 also has first through holes 56 extending through the power supply layers 53 and the ground layers 54 and interconnecting the signal layers 55, and second through holes 57 extending through the power supply layers 53 and interconnecting the ground layers 54. The first through holes 56 and the second through holes 57 are disposed closely to each other.

Conductor lines and through holes (not shown) of the toroidal spiral coil inductors, the power supply layers 53a, the ground layers 54, device power terminals (not shown), device ground terminals (not shown), circuit devices (not shown) which are to be connected to the printed board 51, and decoupling capacitors (not shown) are identical to those of the printed board shown in FIGS. 2 through 5, and will not be described in detail below. In the printed board shown in FIGS. 2 through 5, the device power terminals are disposed on the power layer, and the device ground terminals are disposed on the ground layer. However, the device power terminals and the device ground terminals may be disposed on any of these conductor layers.

The first through holes 56 which interconnect the signal layers 55 and the second through holes 57 which interconnect the ground layers 54 are disposed closely to each other, lowering the impedance between the signal layers 55 and the ground layers 54. The lowered impedance between the signal layers 55 and the ground layers 54 reduces electromagnetic noise induced by signal currents flowing through the first through holes 56 and minimizes distortions of the signal waveform.

Figure 11:
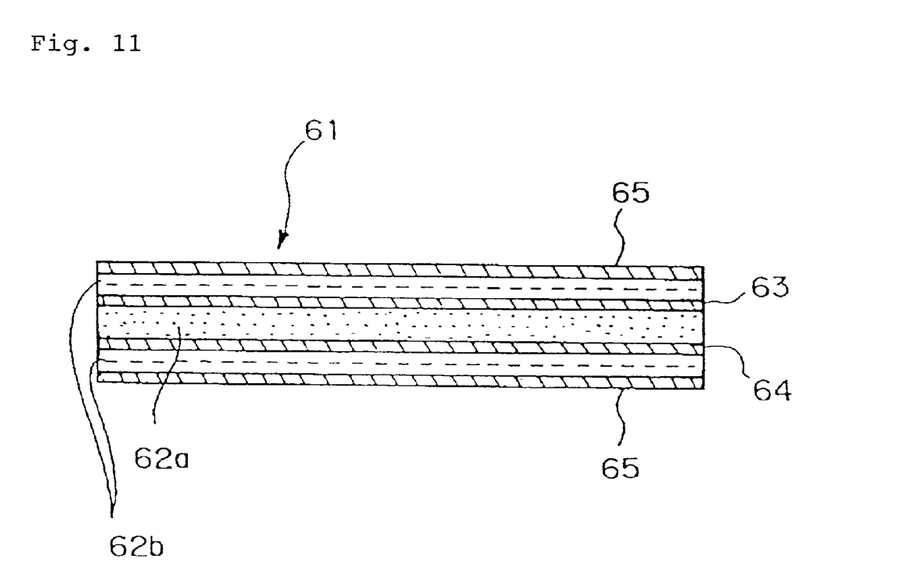
FIG. 11 is a cross-sectional view of a printed board according to a second embodiment of the present invention.

FIG. 11 shows in cross section a printed board 61 according to a second embodiment of the present invention. As shown in FIG. 11, the printed board 61 has a power supply layer 63 disposed on an upper surface of a first insulating layer 62a and a ground layer 64 disposed on a lower surface of the first insulating layer 62a. Second insulating layers 62b are disposed respectively on outer surfaces of the power supply layer 63 and the ground layer 64. Signal layers 65 are disposed respectively on outer surfaces of the second insulating layers 62b. Toroidal spiral coil inductors (not shown) are disposed between the power supply layer 63 and the ground layer 64.

Conductor lines and through holes (not shown) of the toroidal spiral coil inductors, the power supply layer 63, the ground layer 64, device power terminals (not shown), device ground terminals (not shown), circuit devices (not shown) which are to be connected to the printed board 61, and decoupling capacitors (not shown) are identical to those of the printed board shown in FIGS. 2 through 5, and will not be described in detail below.

The first insulating layer 62a is made of an epoxy-base insulating solvent mixed with a magnetic material. The magnetic material may comprise, for example, fine powder of Ni—Zn ferrite, fine powder of Mn—Zn ferrite, fine powder of Li ferrite, fine powder of Sendust, a fine powder of amorphous material, and a fine powder of Permalloy.

Figure 12:
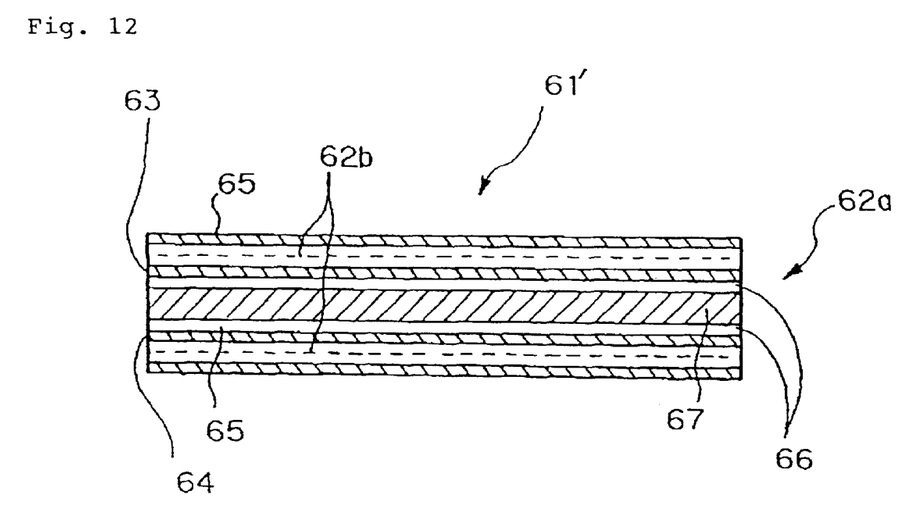
FIG. 12 is a cross-sectional view of a modification of the printed board shown in FIG. 11.

FIG. 12 shows a modified printed board 61' having a first insulating layer 62a which comprises an amorphous magnetic foil 67 with their opposite surfaces each coated with an insulating coating 66. Other details of the modified printed board 61' are identical to those of the printed board 61 shown in FIG. 11.

The first insulating layer 62a mixed with a magnetic material functions as the magnetic core of the toroidal spiral coil inductors disposed between the power supply layer 63 and the ground layer 64. Therefore, the inductance of the toroidal spiral coil inductors increases. The first insulating layer 62a can be formed simply by mixing a magnetic material with an epoxy-base insulating solvent. Therefore, the process of fabricating the printed board is not greatly affected by employing the first insulating layer 62a. If the amorphous magnetic foil 67 with the insulating coating 66 on its opposite surfaces is employed, then since no time is required for an epoxy-base insulating solvent to solidify, the time required to form the amorphous magnetic foil 67 is relatively short.

Figure 13:
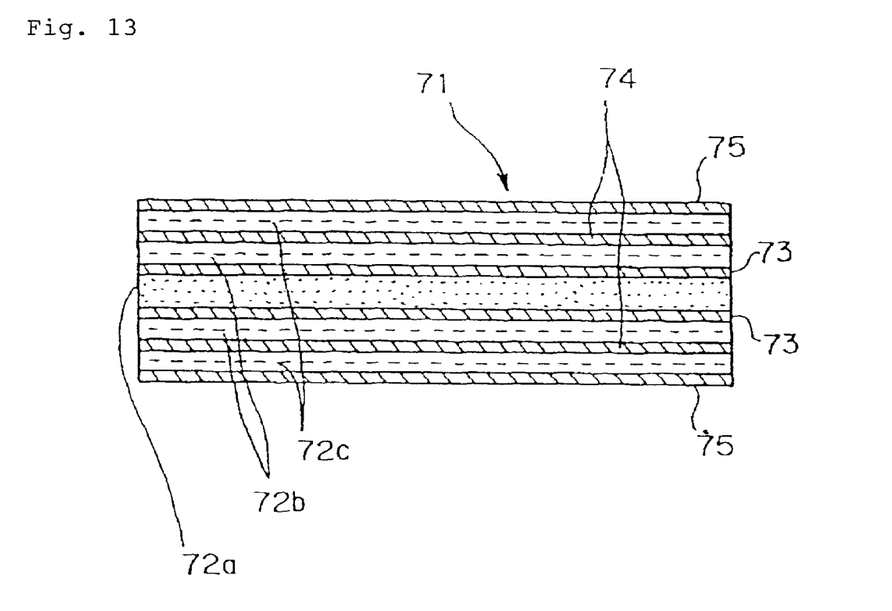
FIG. 13 is a cross-sectional view of a printed board according to a third embodiment of the present invention.
Figure 14:
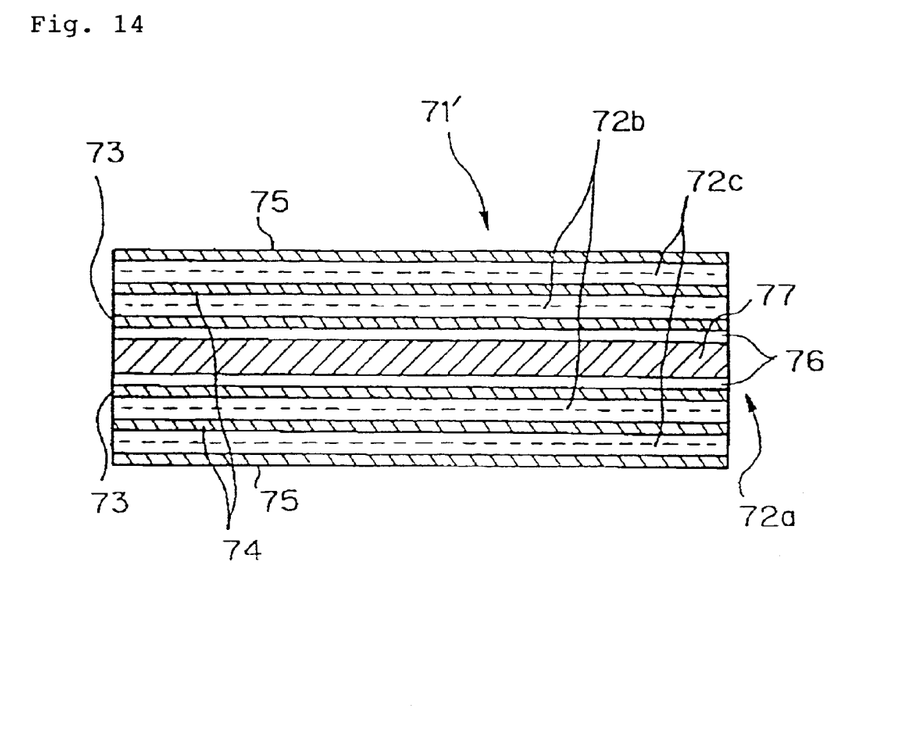
FIG. 14 is a cross-sectional view of a modification of the printed board shown in FIG. 13.

In FIGS. 11 and 12, the printed boards 61, 61' have four layers including the power supply layer 63, the ground layer 64, and the two signal layers 65 in addition to the insulating layers. However, as shown in FIGS. 13 and 14, a printed board 71 according to a third embodiment of the present invention and a modified printed board 71' have six layers including power supply layers 73, ground layers 74, and signal layers 75 in addition to first, second, and third insulating layers 72a, 72b, 72c. In the printed boards 71, 71', the second insulating layers 72b, the third insulating layers 72c, the power supply layers 73, the ground layers 74, the signal layers 75, and the toroidal spiral coil inductors (not shown) disposed between the power supply layers 73 are identical to the corresponding members of the printed board 41 shown in FIG. 9, and will not be described in detail below.

In the printed board 71 shown in FIG. 13, the first insulating layer 72a is mixed with an insulating magnetic material, as with the printed board 61 shown in FIG. 11. The printed board 71' shown in FIG. 14 has a first insulating layer which comprises an amorphous magnetic foil 77 with their opposite surfaces each coated with an insulating coating 76, as with the printed board 61' shown in FIG. 12.

Figure 15:
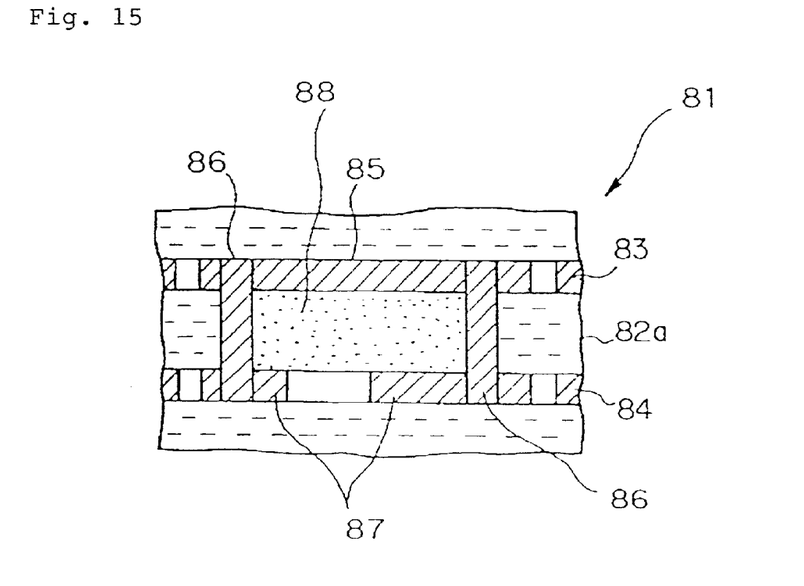
FIG. 15 is a fragmentary cross-sectional view of a toroidal spiral coil inductor in a printed board which is a modification of the printed boards shown in FIGS. 11 through 14.

FIG. 15 shows in fragmentary cross section a toroidal spiral coil inductor in a printed board which is a modification of the printed boards shown in FIGS. 11 through 14.

In the printed boards shown in FIGS. 11 through 14, the first insulating layer contains a magnetic material in its entirety. However, the magnetic material may not be present in the whole region of the first insulating layer. In a printed board 81 shown in FIG. 15, a magnetic material is present only in a coil interior 88 of a toroidal spiral coil inductor which is disposed in a region of a first insulating layer 82a that is surrounded by conductor lines 85, 87 in a power supply layer 83 and a ground layer 84, and through holes 86 interconnecting the conductor lines 85, 87, i.e., formed between the power supply layer 83 and the ground layer 84. Therefore, the first insulating layer 82a in the coil interior 88 functions as the magnetic core of the toroidal spiral coil inductor, increasing the inductance of the toroidal spiral coil inductor.

While preferred embodiments of the present invention have been described using specific terms, such description is for illustrative purposes only, and it is to be understood that changes and variations may be made without departing from the spirit or scope of the following claims.

What is claimed is:

1. A printed board on which a circuit device having a power supply terminal and a ground terminal and a decoupling capacitor having a pair of terminals are to be mounted, said printed board comprising:

at least two conductor layers including a power supply layer and a ground layer, said power supply layer having a power supply line and said ground layer having a ground line;

a device power terminal disposed on one of said conductor layers and to be connected to the power supply terminal of the circuit device and one of the terminals of the decoupling capacitor;

a device ground terminal disposed on one of said conductor layers and to be connected to the ground terminal of the circuit device and the other of the terminals of the decoupling capacitor, said device ground terminal being connected to said ground line of the ground layer; and a spiral coil inductor comprising a plurality of conductor lines defined by frame-like recesses defined in opposite ones of said conductor layers, and through holes or via holes interconnecting said conductor lines, said spiral coil inductor having a terminal connected to said power supply line of said power supply layer and another terminal connected to said device power terminal.

2. A printed board according to claim 1, wherein said spiral coil inductor comprises a toroidal spiral coil inductor.

3. A printed board according to claim 1, wherein said opposite ones of said conductor layers comprise said power supply layer and said ground layer, respectively.

4. A printed board according to claim 1, wherein said conductor layers comprise two opposite power supply layers and two ground layers disposed respectively on surfaces of said two opposite power supply layers, said conductor layers of the spiral coil inductor being disposed on said two opposite power supply layers.

5. A printed board according to claim 4, wherein said conductor layers further comprise two signal layers disposed respectively on surfaces of said ground layers, said through holes or via holes including first through holes or via holes extending through said power supply layers and said ground layers and interconnecting said signal layers and second through holes or via holes extending through said power supply layers and interconnecting said ground layers, said first and second through holes or via holes are being disposed closely to each other.

6. A printed board according to claim 1, further comprising an insulating layer disposed between said opposite ones of said conductor layers, said insulating layer containing a magnetic material.

7. A printed board according to claim 6, wherein said insulating layer is disposed in a coil interior surrounded by at least the conductor lines of said spiral coil inductor and said through holes or via holes.

8. A printed board according to claim 6, wherein said insulating layer comprises an insulating solvent mixed with a fine powder of Ni—Zn ferrite as said magnetic material.

9. A printed board according to claim 6, wherein said insulating layer comprises an insulating solvent mixed with a fine powder of Mn—Zn ferrite as said magnetic material.

10. A printed board according to claim 6, wherein said insulating layer comprises an insulating solvent mixed with a fine powder of Li ferrite as said magnetic material.

11. A printed board according to claim 6, wherein said insulating layer comprises an insulating solvent mixed with a fine powder of Sendust as said magnetic material.

12. A printed board according to claim 6, wherein said insulating layer comprises an insulating solvent mixed with a fine powder of amorphous material as said magnetic material.

13. A printed board according to claim 6, wherein said insulating layer comprises an insulating solvent mixed with a fine powder of Permalloy as said magnetic material.

14. A printed board according to claim 6, wherein said insulating layer comprises an amorphous material foil having opposite surfaces each coated with an insulating coating.

15. A printed board comprising:
   at least two conductor layers; and
   a toroidal spiral coil inductor comprising a plurality of conductor lines defined by frame-like recesses defined in opposite ones of said conductor layers, and through holes or via holes interconnecting said conductor lines.

* * * * *